(12) United States Patent
Sewell et al.

(10) Patent No.: US 9,831,377 B2
(45) Date of Patent: Nov. 28, 2017

(54) DIE-CUTTING APPROACHES FOR FOIL-BASED METALLIZATION OF SOLAR CELLS

(71) Applicants: Richard Hamilton Sewell, Los Altos, CA (US); Benjamin Ian Hsia, Fremont, CA (US)

(72) Inventors: Richard Hamilton Sewell, Los Altos, CA (US); Benjamin Ian Hsia, Fremont, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/055,912

(22) Filed: Feb. 29, 2016

(65) Prior Publication Data

US 2017/0250305 A1    Aug. 31, 2017

(51) Int. Cl.
*H01L 31/18* (2006.01)
*H01L 31/0368* (2006.01)
*H01L 31/0392* (2006.01)
*H01L 31/0224* (2006.01)
*H01L 31/0745* (2012.01)

(52) U.S. Cl.
CPC .. *H01L 31/1876* (2013.01); *H01L 31/022433* (2013.01); *H01L 31/03685* (2013.01); *H01L 31/03921* (2013.01); *H01L 31/0745* (2013.01); *H01L 31/1824* (2013.01); *H01L 31/1864* (2013.01)

(58) Field of Classification Search
CPC ............. H01L 31/1876; H01L 31/1824; H01L 31/1864; H01L 31/03685; H01L 31/022; H01L 31/433; H01L 31/0745
See application file for complete search history.

(56) References Cited

U.S. PATENT DOCUMENTS

| 2008/0216887 | A1  | 9/2008  | Hacke et al. |
| 2012/0204938 | A1  | 8/2012  | Hacke et al. |
| 2014/0090698 | A1* | 4/2014  | Kumai ............... H05K 3/20 136/251 |
| 2014/0338739 | A1  | 11/2014 | Liu et al. |
| 2015/0090329 | A1  | 4/2015  | Pass |

(Continued)

FOREIGN PATENT DOCUMENTS

| JP | 2015070221 | 4/2015 |
| WO | WO-2012128909 | 9/2012 |

OTHER PUBLICATIONS

International Search Report and Written Opinion from PCT/US2017/019528 dated May 24, 2017, 13 pgs.

*Primary Examiner* — Long Pham
(74) *Attorney, Agent, or Firm* — Schwabe, Williamson & Wyatt, P.C.

(57) ABSTRACT

Die-cutting approaches for foil-based metallization of solar cells, and the resulting solar cells are disclosed herein. Die-cutting approaches for foil-based metallization of solar cells include forming a plurality of semiconductor regions in or above a substrate and forming a patterned damage buffer in alignment with locations between the plurality of semiconductor regions. Additionally, a metal layer comprising a metal seed layer and/or metal foil is formed over the patterned damage buffer. The metal layer is cut by a cutting die at locations between the plurality of semiconductor regions by applying a mechanical force to the cutting die.

20 Claims, 11 Drawing Sheets

(56) References Cited

U.S. PATENT DOCUMENTS

2015/0280021 A1   10/2015  Harley et al.
2016/0099389 A1*  4/2016  Tischler .................. H01L 29/00
                                                                                      257/98
2016/0181447 A1*  6/2016  Kim ................ H01L 31/022441
                                                                                      136/256

* cited by examiner

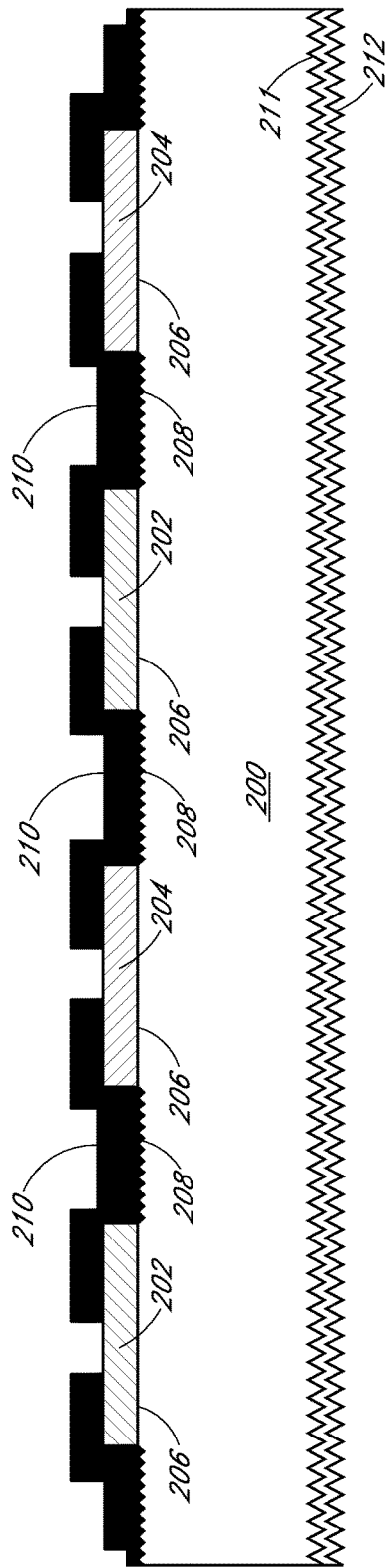
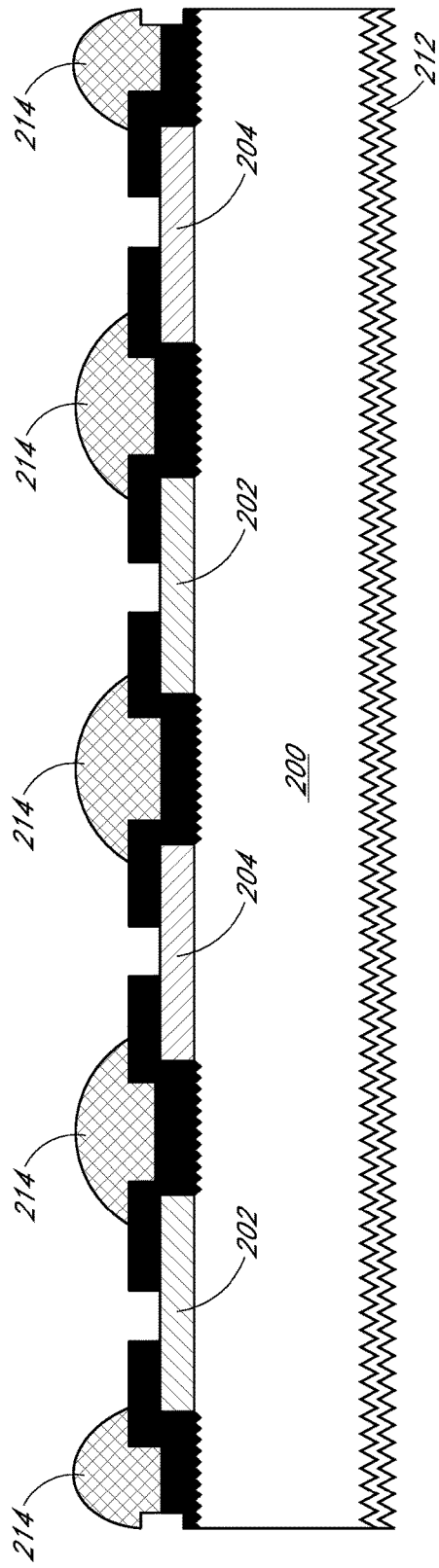
FIG. 2A
FIG. 2B

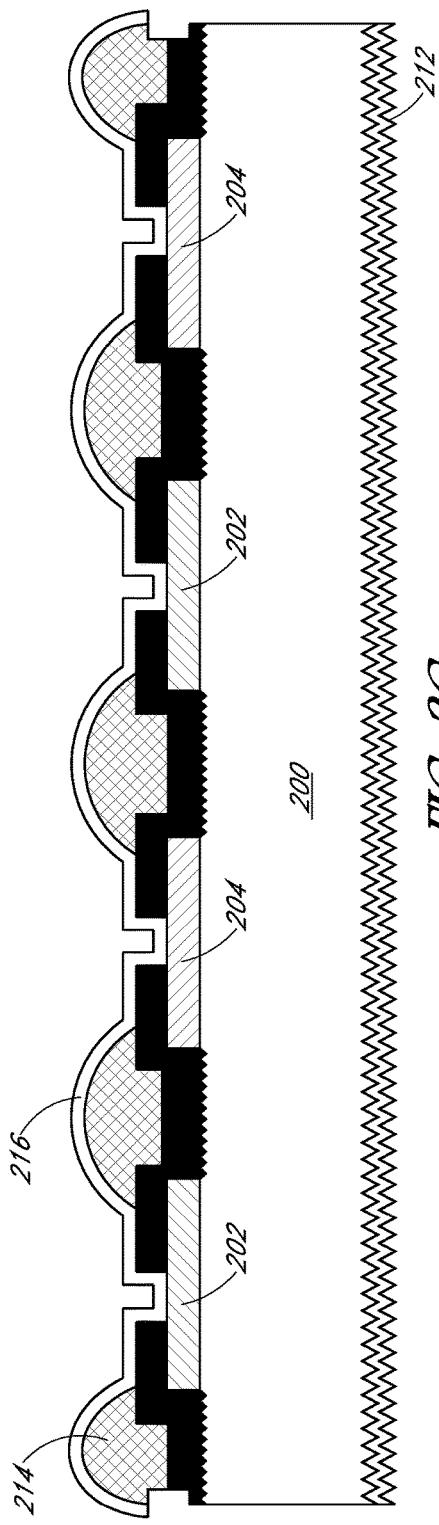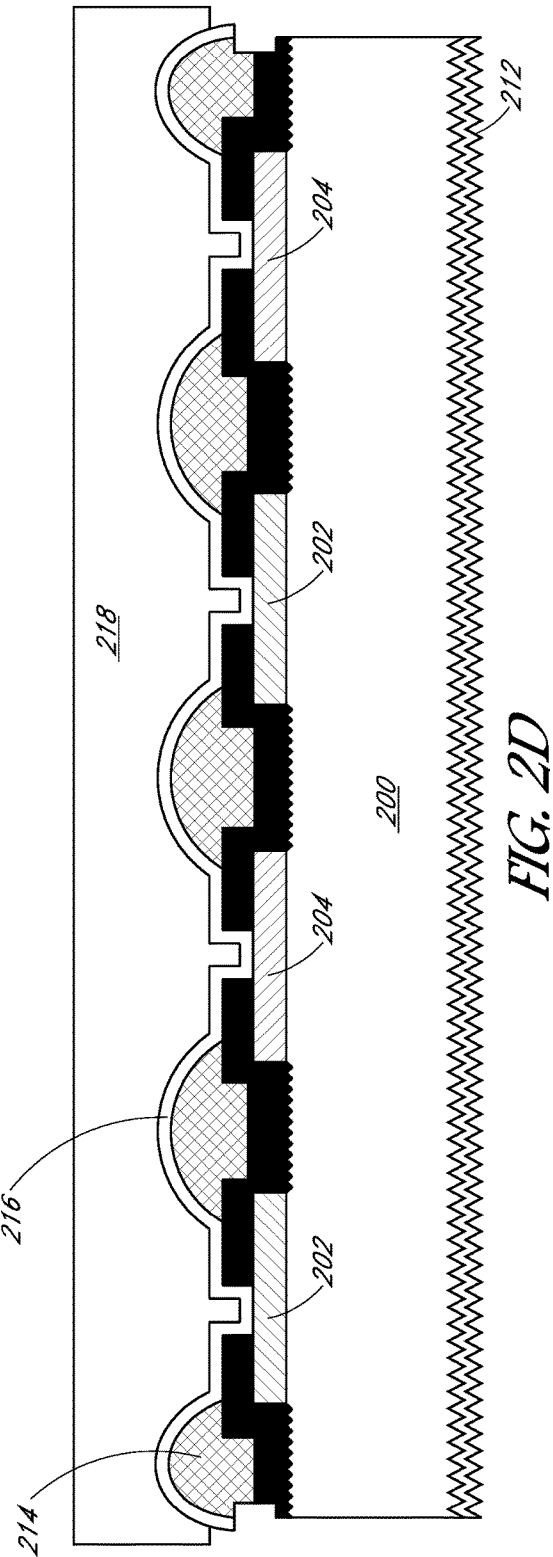

DIE-CUTTING APPROACHES FOR FOIL-BASED METALLIZATION OF SOLAR CELLS

BACKGROUND

Photovoltaic (PV) cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

FIG. 2A-2G illustrate cross-sectional views of various stages in the fabrication of a solar cell, according to an embodiment;

DETAILED DESCRIPTION

Figure 1:
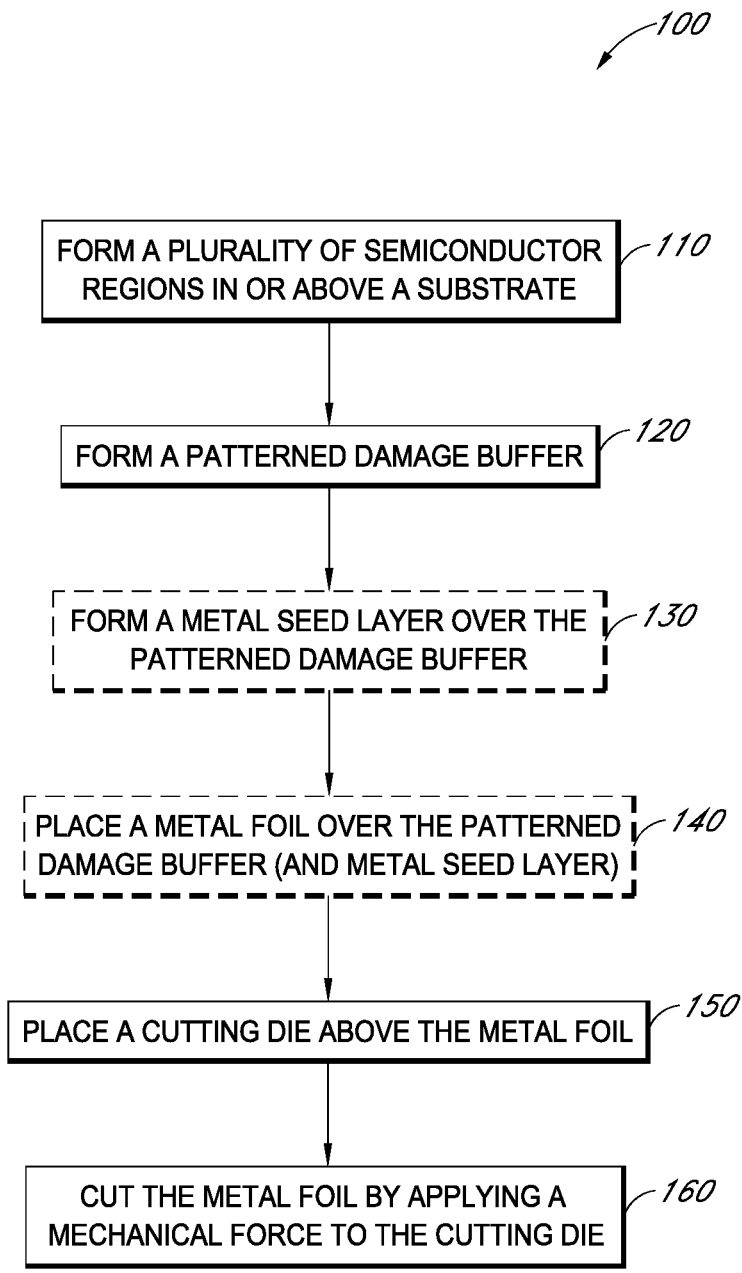
FIG. 1 illustrates a flowchart 100 listing operations in a method of fabricating a solar cell, according to an embodiment.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Terminology—The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

This term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" encapsulant layer does not necessarily imply that this encapsulant layer is the first encapsulant layer in a sequence; instead the term "first" is used to differentiate this encapsulant from another encapsulant (e.g., a "second" encapsulant).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used herein, "regions" can be used to describe discrete areas, volumes, divisions or locations of an object or material having definable characteristics but not always fixed boundaries.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

Although many of the examples described herein are back contact solar cells, the techniques and structures apply equally to other (e.g., front contact) solar cells as well. Moreover, although much of the disclosure is described in terms of solar cells for ease of understanding, the disclosed techniques and structures apply equally to other semiconductor structures (e.g., silicon wafers or substrates generally).

Methods of fabricating solar cells using cutting dies in foil-based metallization approaches, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell includes forming a plurality of semiconductor regions in or above a substrate. The method also includes forming a patterned damage buffer corresponding to, or in alignment with locations between the plurality of semiconductor regions. In some embodiments, the method includes forming a metal seed layer over the patterned damage buffer. The method also includes placing a metal foil over the patterned damage buffer and in some embodiments, over metal seed layer. Additionally, the method includes placing a cutting die above the metal foil. The method also includes cutting the metal foil at locations between the plurality of semiconductor regions and/or at edge regions of the substrate by applying a mechanical force to the cutting die. In an embodiment, the cutting operation electrically isolates regions of the metal foil corresponding to underlying semiconductor regions. The patterned damage buffer protects underlying regions of the solar cell during the die-cutting operation.

Also disclosed herein are solar cells fabricated in a foil-based metallization approach using a cutting die. In an embodiment, a solar cell includes a substrate. A plurality of semiconductor regions are disposed in and/or above the substrate. The solar cell further comprises a patterned damage buffer in alignment with locations between the plurality of semiconductor regions. In some embodiments, the solar cell comprises a metal seed layer above the patterned damage buffer. The solar cell further comprises a patterned metal foil over the patterned damage buffer and/or a metal seed layer. In an embodiment, the patterned metal foil comprises electrically isolated regions corresponding to or in alignment with the plurality of semiconductor regions. The patterned damage buffer has a minimal thickness to protect the plurality of semiconductor regions during a die-cutting operation of the foil-based metallization approach.

One or more embodiments described herein provide for foil-based metallization of solar cells using a die-cutting approach. In an embodiment, in the context of metallization of solar cells by patterning a metallic foil with a cutting die, a thin damage buffer protects silicon-containing portions of the cell from cutter blades of the cutting die. Foil-based metallization using cutting dies enables a low cost cell metallization without electroplating. Advantages further include reduction of the cost of manufacturing a solar cell due to simplification of the metallization process and reduction in the cost of damage buffer material needed to protect underlying layers of a solar cell during metallization processes.

Other methods for patterning of foils for solar cell metallization include laser cutting and lithographic processes, or mask and etch processes. Laser cutting requires a thick damage buffer to prevent laser damage to underlying layers of the solar cell. Laser cutting can also require damage buffer materials which are optically opaque and/or have a high temperature stability. Lithographic, or mask and etch processes require long etching times (~10 minutes) and often result in retention of liquid etchant within the solar cell. One or more embodiments disclosed herein disclose a foil-based metallization approach based on die-cutting operations in combination with a thin damage buffer concept.

FIG. 1 is a flowchart 100 listing operations in a method of fabricating a solar cell, in accordance with an embodiment of the present disclosure. Optional operations of flowchart 100 are indicated by dashed lines. In an exemplary process flow, FIG. 2A-2G illustrate cross-sectional views of various stages in the fabrication of a solar cell as corresponding to flowchart 100 of FIG. 1, in accordance with an embodiment of the present disclosure.

Referring to operation 110 of flowchart 100 and to corresponding FIG. 2A, a method of fabricating a solar cell includes forming a plurality of semiconductor regions 202, 204 in and/or above a substrate 200. In some embodiments, a thin dielectric material 206 may be included as an intervening material between the semiconductor regions 202, 204 and the substrate 200. The substrate 200 has a light-receiving surface 211 opposite a back surface above which the plurality of semiconductor regions 202, 204 is formed. In an embodiment, as depicted in FIG. 2A, each of the plurality of semiconductor regions 202, 204 is spaced apart from one another. In a specific embodiment, the plurality of semiconductor regions 202, 204 is a plurality of alternating N-type 202 and P-type 204 semiconductor regions.

In an embodiment, the substrate 200 is a monocrystalline silicon substrate, such as a bulk single crystalline N-type doped silicon substrate. It is to be appreciated, however, that substrate 200 may be a layer, such as a multi-crystalline silicon layer, disposed on a global solar cell substrate. In an embodiment, the thin dielectric layer 206 is a tunneling silicon oxide layer having a thickness of approximately 2 nanometers or less. In one such embodiment, the term "tunneling dielectric layer" refers to a very thin dielectric layer, through which electrical conduction can be achieved. Not to be bound by any particular theory, but the conduction may be due to quantum tunneling and/or the presence of small regions of direct physical connection through thin spots in the dielectric layer. In one embodiment, the tunneling dielectric layer is or includes a thin silicon oxide layer.

In an embodiment, in the case that the plurality of semiconductor regions 202, 204 is a plurality of alternating N-type 202 and P-type 204 semiconductor regions, the alternating N-type and P-type semiconductor regions 202 and 204, respectively, are polycrystalline silicon regions formed by, e.g., using a plasma-enhanced chemical vapor deposition (PECVD) process. In one such embodiment, the N-type polycrystalline silicon regions 202 are doped with an N-type impurity, such as phosphorus. The P-type polycrystalline silicon regions 204 are doped with a P-type impurity, such as boron. As is depicted in FIG. 2A, the alternating N-type and P-type semiconductor regions 202 and 204 may have trenches 208 formed there between, the trenches 208 extending partially into the substrate 200. In an embodiment, an insulating layer 210 is disposed in the trenches 208 and between and partially on the alternating N-type and P-type semiconductor regions 202 and 204, as is depicted in FIG. 2A.

In an embodiment, the light receiving surface 211 is a texturized light receiving surface, as is depicted in FIG. 2A. In one embodiment, a hydroxide-based wet etchant is employed to texturize the light receiving surface 211 of the substrate 200 and, possibly, the trench 208 surfaces as is also depicted in FIG. 2A. It is to be appreciated that the timing of the texturizing of the light receiving surface may vary. For example, the texturizing may be performed before or after the formation of the thin dielectric layer 206. In an embodiment, a texturized surface may be one which has a regular or an irregular shaped surface for scattering incoming light, decreasing the amount of light reflected off of the light receiving surface 211 of the solar cell. Referring again to FIG. 2A, additional embodiments can include formation of a passivation and/or anti-reflective coating (ARC) layers (shown collectively as layer 212) on the light receiving surface 211. It is to be appreciated that the timing of the formation of passivation and/or ARC layers may also vary.

In an embodiment, the plurality of semiconductor regions 202, 204 is formed from a polycrystalline silicon layer formed above the substrate 200, which may be single crystalline silicon substrate, as described above. In another embodiment, however, the substrate 200 is a single crystalline silicon substrate having the plurality of semiconductor regions 202, 204 formed therein, as opposed to being formed in a semiconductor layer distinct from the substrate 200.

A plurality of contact openings can be formed in insulating layer 210. The plurality of contact openings can provide exposure to the plurality of n-type doped polysilicon regions 202 and to the plurality of p-type doped polysilicon regions 204. In one embodiment, the plurality of contact openings is formed by laser ablation. In one embodiment, the contact openings to the n-type doped polysilicon regions 202 have substantially the same height as the contact openings to the p-type doped polysilicon regions 204.

In an embodiment, the method of fabricating a solar cell also includes forming a patterned damage buffer between and/or above the plurality of semiconductor regions. Referring to operation 120 of flowchart 100 and to corresponding FIG. 2B, a patterned damage buffer 214 is disposed in a configuration between and partially above the alternating N-type and P-type semiconductor regions 202 and 204. The patterned damage buffer can be formed in any desired pattern or configuration to protect underlying layers of the solar cell during cutting operations for electrically isolating metal foil contacting semiconductor regions and/or trimming of excess metal foil. In some embodiments, a damage buffer may be disposed as a substantially continuous layer.

In some embodiments, the patterned damage buffer 214 may be formed in a single operation. In other embodiments, the patterned damage buffer can be formed in successive stages or steps. The patterned damage buffer can be formed by screen-printing, chemical vapor deposition, physical vapor deposition or by any other suitable method.

In an embodiment, the patterned damage buffer comprises a material such as, but not limited to carbonaceous materials (e.g. graphite), organic binders, organic polymers, epoxies, acrylics, polyimides, polyamides, polyesters, polyurethanes, cellulosic compounds (e.g. ethyl cellulose), glass frits, silicones, siloxanes, inorganic pigments, their derivatives or combinations thereof. It is appreciated that damage buffers used in laser cutting processes must be stable to high temperatures produced by the laser, whereas damage buffers used in die cutting processes described herein can have a lower temperature stability. Additionally, there is no requirement for optically opaque materials which can be necessary in laser-based processing of metallic foils.

In an embodiment, the patterned damage buffer is formed with a minimal thickness to protect the underlying layers of the solar cell from cutter blades used in subsequent operations. For example, the damage buffer described herein can have a thickness less than 30 µm. As another example, the damage buffer described herein can have a thickness less than 20 µm. The inventors have found that laser cutting processes usually require thicker damage buffers (e.g. >20 µm) to protect underlying layers of the solar cell from laser-induced damage, whereas die-cutting processes described herein enable thinner damage buffers to be employed.

Referring to optional operation 130 of flowchart 100 and to corresponding FIG. 2C, a metal seed layer 216 can be formed over the patterned damage buffer 214. In some embodiments, the metal seed layer comprises aluminum, for example, the metal seed layer can comprise aluminum in an amount greater than approximately 90 atomic %. In an embodiment, the metal seed layer is a layer having a thickness approximately in the range of 0.05 to 20 microns. The metal seed layer can be formed by any suitable method, for example sputter deposition, chemical vapor deposition or physical vapor deposition. In some embodiments, the metal seed layer can comprise the same metal and/or composition as the metal foil, if present.

Referring to optional operation 140 of flowchart 100 and to corresponding FIG. 2D, the method of fabricating a solar cell comprises placing a metal foil 218 over the patterned damage buffer 214 and metal seed layer 216, if present. In an embodiment, the metal foil 218 is an aluminum (Al) foil having a thickness less than 200 µm. As another example, the metal foil can have a thickness approximately in the range of 5-100 microns. In one embodiment, the metal foil is an aluminum alloy foil including aluminum and second element such as, but not limited to, copper, manganese, silicon, magnesium, zinc, tin, lithium, or combinations thereof. In one embodiment, the aluminum foil is a temper grade foil such as, but not limited to, F-grade (as fabricated), O-grade (full soft), H-grade (strain hardened) or T-grade (heat treated). In one embodiment, the aluminum foil is an anodized aluminum foil.

In an embodiment, at the time of joining the metal foil 218 and the substrate 200, the metal foil 218 has a surface area substantially larger than a surface area of the wafer substrate 200 of the solar cell. In one such embodiment, subsequent to contacting the metal foil 218 to the metallized surface of the substrate 200, the metal foil is cut to provide the metal foil 218 having a surface area substantially the same as the surface area of the substrate 200 of the solar cell. In another embodiment, however, prior to placing the metal foil 218 over the metallized surface of the solar cell, a large sheet of foil is cut to provide the metal foil 218 having a surface area substantially the same as a surface area of the substrate 200 of the solar cell, as is depicted in FIG. 2D. In some embodiments, the method of fabricating a solar cell can comprise a step of putting a metal layer over or above the patterned damage buffer. The step of putting a metal layer over or above the patterned damage buffer can comprise forming a metal seed layer over the patterned damage buffer (e.g. step 130 of flowchart 100), placing a metal foil over or above the patterned damage buffer (e.g. step 140 of flowchart 100) or a combination thereof. In some embodiments, a metal seed layer in the absence of a metal foil can be used as a metallization structure for underlying semiconductor regions of solar cell, as described below. In yet other embodiments, a metal foil in the absence of a metal seed layer can be used as a metallization structure for underlying semiconductor regions.

Figure 2E:
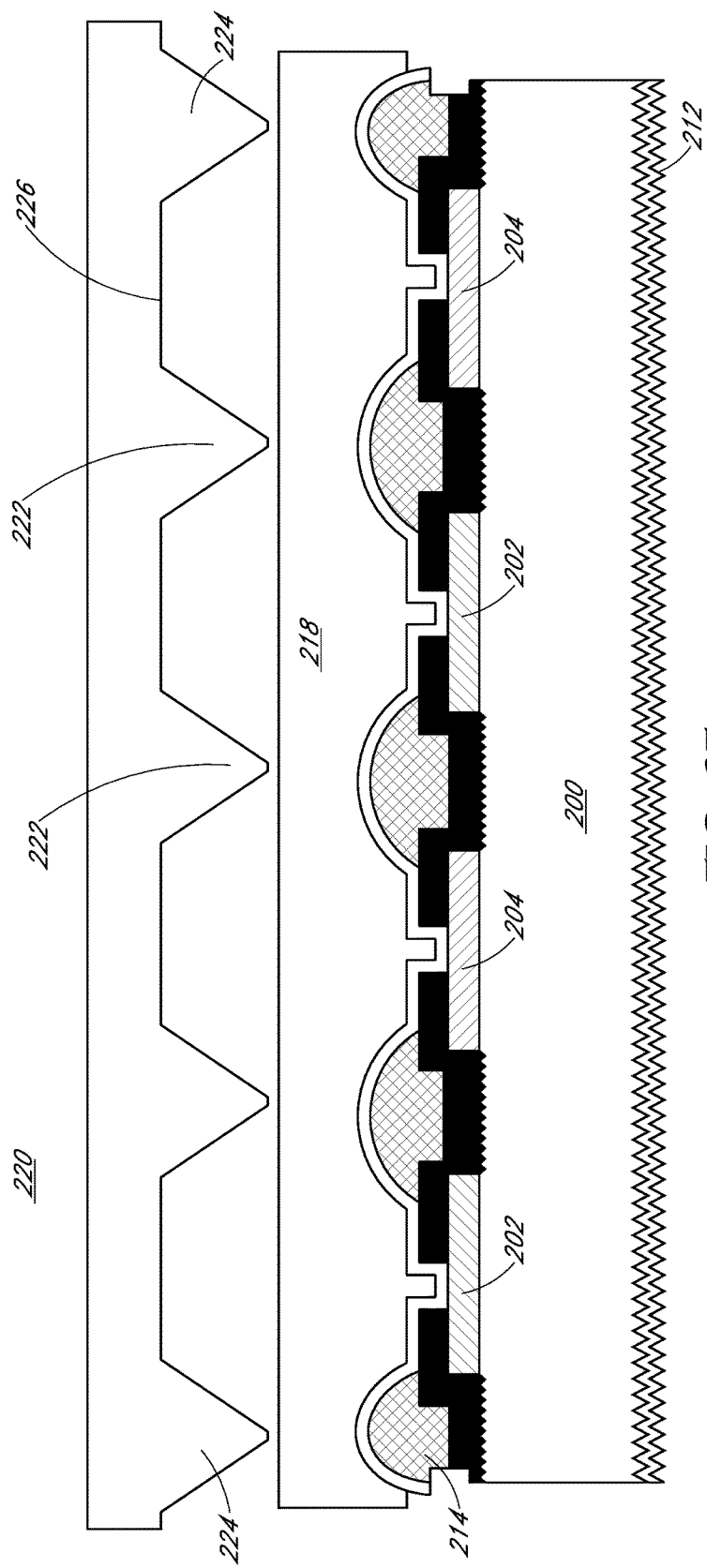

In an embodiment, the ultimate metallization layer for fabricating electrical contacts for a solar cell is a metal foil layer, such as an aluminum metal foil. A metal foil may ultimately be patterned to provide patterned electrical contacts for underlying semiconductor regions of a solar cell. As described herein, the patterning of the metal foil can be performed by a die-cutting operation. Referring to operation 150 of flowchart 100 and to corresponding FIG. 2E, the method of fabricating a solar cell comprises placing a cutting die 220 above the metal foil 218. The cutting die can comprise a plurality of cutter blades 222 arranged in a predetermined configuration and spacing. In an embodiment, the cutter blades 222 are aligned with the damage buffer 214 and/or locations between the plurality of alternating N-type and P-type polycrystalline silicon semiconductor regions 202, 204, as depicted in FIG. 2E.

In one embodiment, the cutting die 220 comprises at least one peripheral cutter blade 224 configured to align with edge regions of the wafer or substrate 200. In some embodiments, a single cutter blade can be employed. The cutting die and cutter blade(s) can be provided in any desired pattern or configuration to electrically isolate metal foil regions, electrically isolate metal seed regions and/or trim of excess metal foil during cutting operations. As used herein, electrically isolate refers to physically separating portions of a metal foil or metal seed layer at a groove, indentation or trench formed by a cutting die.

In an embodiment, operation 150 of flowchart 100 can include an alignment operation, for example with the use of optical and/or mechanical positioning guides. In some embodiments, an adjustable cutting die is precisely aligned to a fixed wafer, or a wafer is precisely aligned to a fixed cutting die, by means of optically imaging the wafer and/or die and then mechanically moving the die and/or wafer into alignment.

Figure 2F:
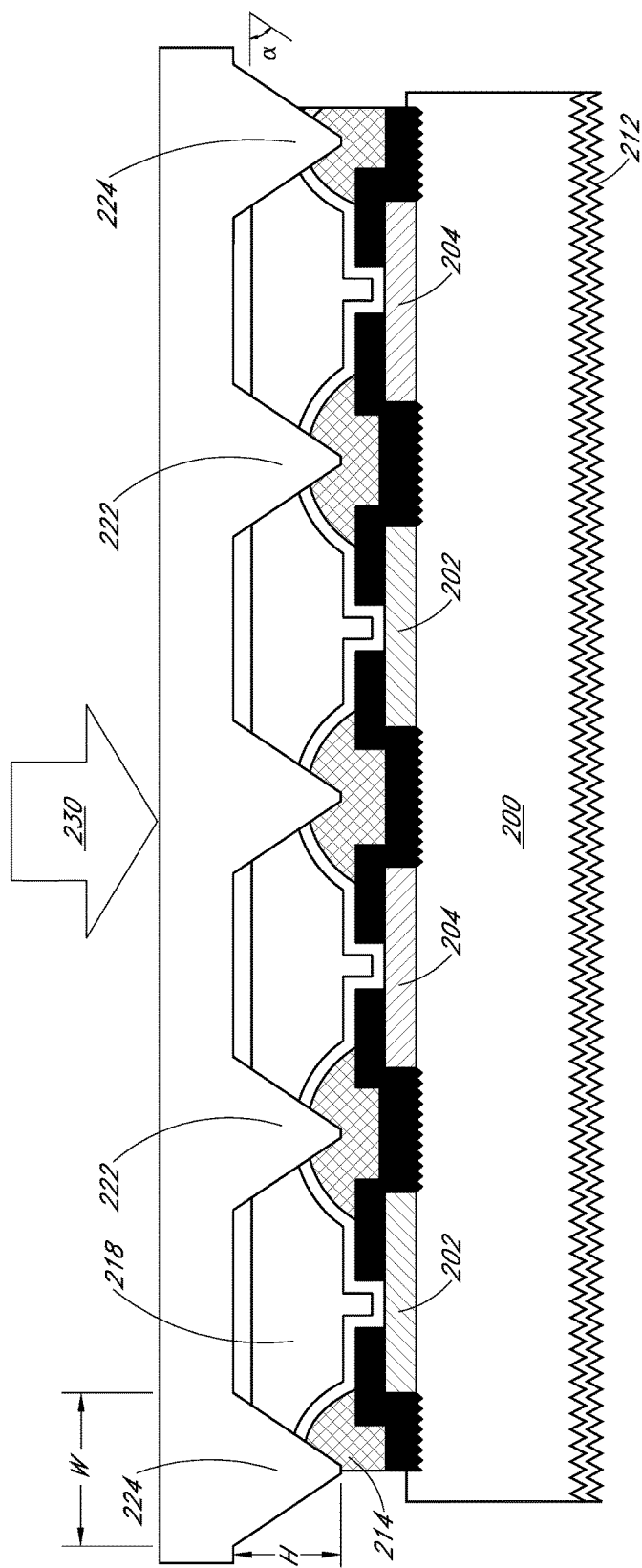

Referring to operation 160 of flowchart 100 and to corresponding FIG. 2F, the method of fabricating a solar cell comprises cutting the metal foil 218 by applying a mechanical force 230 to the cutting die 220. In one embodiment, the cutter blades 222 cut the metal foil 218 at locations between the plurality of semiconductor regions and in alignment with the damage buffer 214, thereby electrically isolating N-type and P-type polycrystalline silicon semiconductor regions 202, 204, as depicted in FIG. 2F.

In one embodiment, the cutting die 220 comprises peripheral cutter blades 224 at edge regions of the substrate 200, as depicted in FIG. 2F. In an embodiment, the method for fabricating a solar cell can comprise trimming the metal foil 218 at edge regions of the substrate 200 by applying a mechanical force 230 to cutting die 220.

In some embodiments, the cutting operation 160 can be performed at ambient temperature e.g. approximately 25° C. In other embodiments, the method for fabricating a solar cell comprises heating the metal foil 218 and/or cutting die 220 by any desirable means. For example, the wafer and/or cutting die can be placed in a heating oven, on a heated plate or conveyer belt, coupled to a heating device, or have a heated stream of gas directed thereto. In some embodiments, the metal foil and/or cutting die can be heated up to 600° C. or as another example, between 100-600° C.

Referring to operation 160 of flowchart 100, any desirable mechanical force 230 can be applied to the cutting die 220 to electrically isolate metal foil regions, electrically isolate metal seed regions and/or trim excess metal foil. In an embodiment, the pressure applied to the cutting die 220 can depend on the dimensions of cutter blades 222, 224, for example the height H, width W and/or length (into plane of FIG. 2F) of cutter blades 222, 224. As a non-limiting example, the cutter blades 222, 224 can have a height less than 50 μm greater than the thickness of the metal foil 218. In another embodiment, the desirable applied pressure can be depend on the area of the cutting die 220, the thickness and type of the metal foil 218, the thickness and type of the metal foil, the thickness and type of the damage buffer 214 and/or the desired depth of grooving by the cutter blades 222, 224. As a non-limiting illustrative example, an approximately 125 mm×125 mm can have approximately 30 meters of grooves, or trench, to cut, which can require approximately 6000 kg of force or 3.8 MPa of pressure.

In an embodiment, the cutting die has cutter blades 222, 224 which are beveled to a predetermined angle α, as depicted in FIG. 2F. The cutter blades 222, 224 can be beveled to any desired angle α. As a non-limiting example, the cutter blades can be beveled between 30-90°.

Figure 2G:
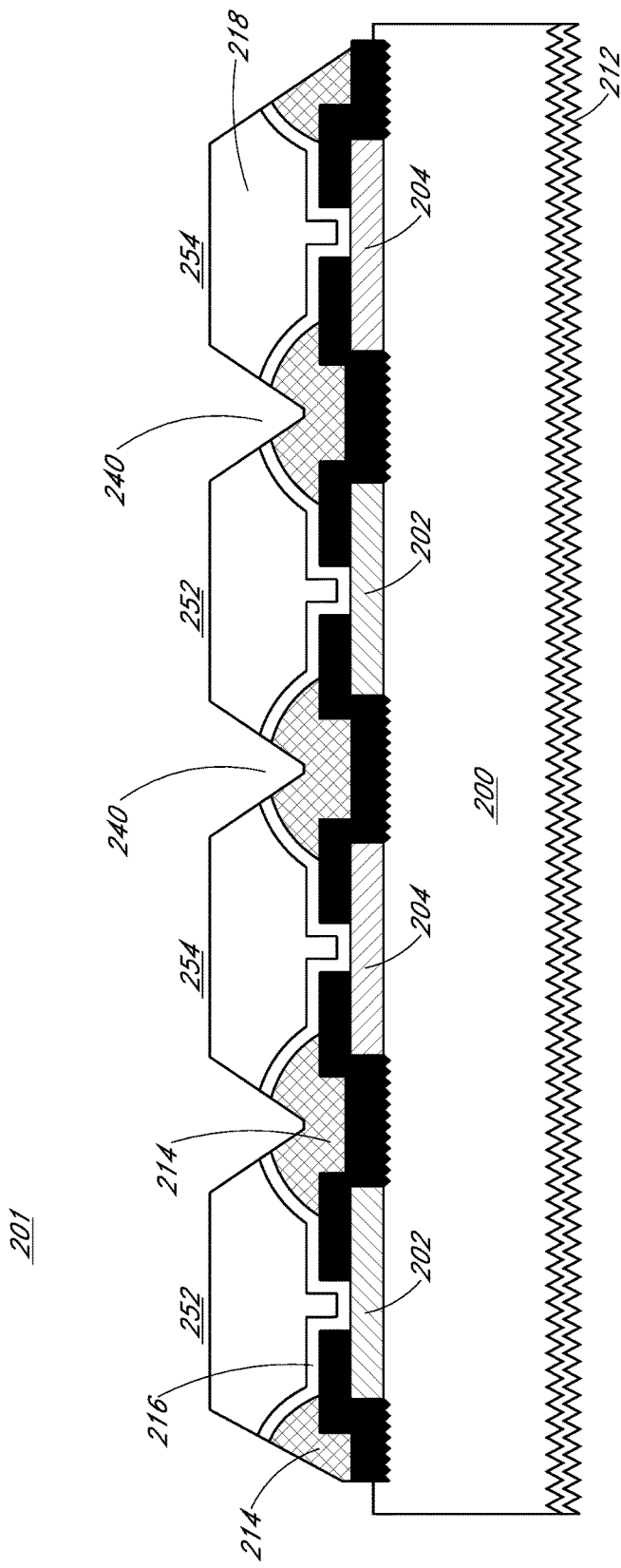

Referring to FIG. 2G, as a result of the cutting operation 160, indentations or grooves 240 are formed in the metal foil 218 corresponding to locations between the alternating N-type and P-type semiconductor regions 202 and 204. According to an embodiment, a solar cell 201 depicted in FIG. 2G is fabricated by the method of flowchart 100. The substrate 200 of solar cell 201 comprises a plurality of semiconductor regions or alternating N-type 202 and P-type 204 semiconductor regions as depicted in FIG. 2G. The solar cell 201 comprises a patterned damage buffer 214 in alignment with locations between the alternating N-type 202 and P-type 204 semiconductor regions. The solar cell 201 further comprises a patterned metal foil 218 comprising indentations or grooves 240 corresponding to locations between the plurality of alternating N-type 202 and P-type 204 semiconductor regions. In one embodiment, the solar cell 201 comprises a patterned damage buffer 214 having a thickness less than 20 µm. In some embodiments, the solar cell 201 comprises a metal foil 218 having a thickness less than 200 µm.

In an embodiment, the grooves or indentations 240 of FIG. 2G are used to electrically isolate conductive regions 252, 254 as metallization structures, or fingers, for the underlying semiconductor regions of the solar cell 201. In one embodiment, the grooves 240 are formed substantially entirely through the metal foil 218 at locations between the alternating N-type and P-type semiconductor regions 202, 204 to form electrically isolated regions 252, 254. The electrically isolated regions 252, 254 are electrically conductive regions, or fingers, corresponding to the alternating N-type 202 and P-type 204 semiconductor regions, respectively. Accordingly, the metal foil 218 is patterned to provide patterned electrical contacts 252, 254 for underlying semiconductor regions 202, 204 of solar cell 201. As used herein, electrically isolating refers to physically separating portions of a metal foil or seed layer such that electrical conduction across a groove or indentation formed by a cutting die is not possible or is otherwise impractical. However, metallization structures or fingers 252, 254 formed between grooves 240, may be connected so as to conduct electrical current through other pathways, for example electrical conduits like busbars in any desired configuration.

In an embodiment, the grooves 240 extend substantially entirely through the metal foil 218, substantially entirely through the metal seed layer 216 (if present, such as in the embodiment as depicted in FIG. 2G) and partially into the damage buffer 214. The grooves can be formed to any desirable depth such that the patterned damage buffer 214 protects the plurality of semiconductor regions during a die-cutting step and/or regions of the metal foil 218 are electrically isolated.

Referring to FIG. 2F-G, the depth of the cutter blades 222, 224, and the depth of the resulting indentations or grooves 240 formed, can be controlled by any suitable means. For example, a mechanical stop or optical guide mechanism can be employed to control the depth of indentations or grooves. In some embodiments, the applied pressure, blade dimensions, damage buffer dimensions and/or type of damage buffer material dictate the depth of the indentations or grooves 240.

FIG. 3-7 illustrate cross-sectional views of stages in the fabrication of a solar cell according to various embodiments. Unless otherwise designated, the components of FIG. 3-7 are similar to those described above with reference to FIG. 2, except that they have been incremented sequentially by 100.

Figure 3:
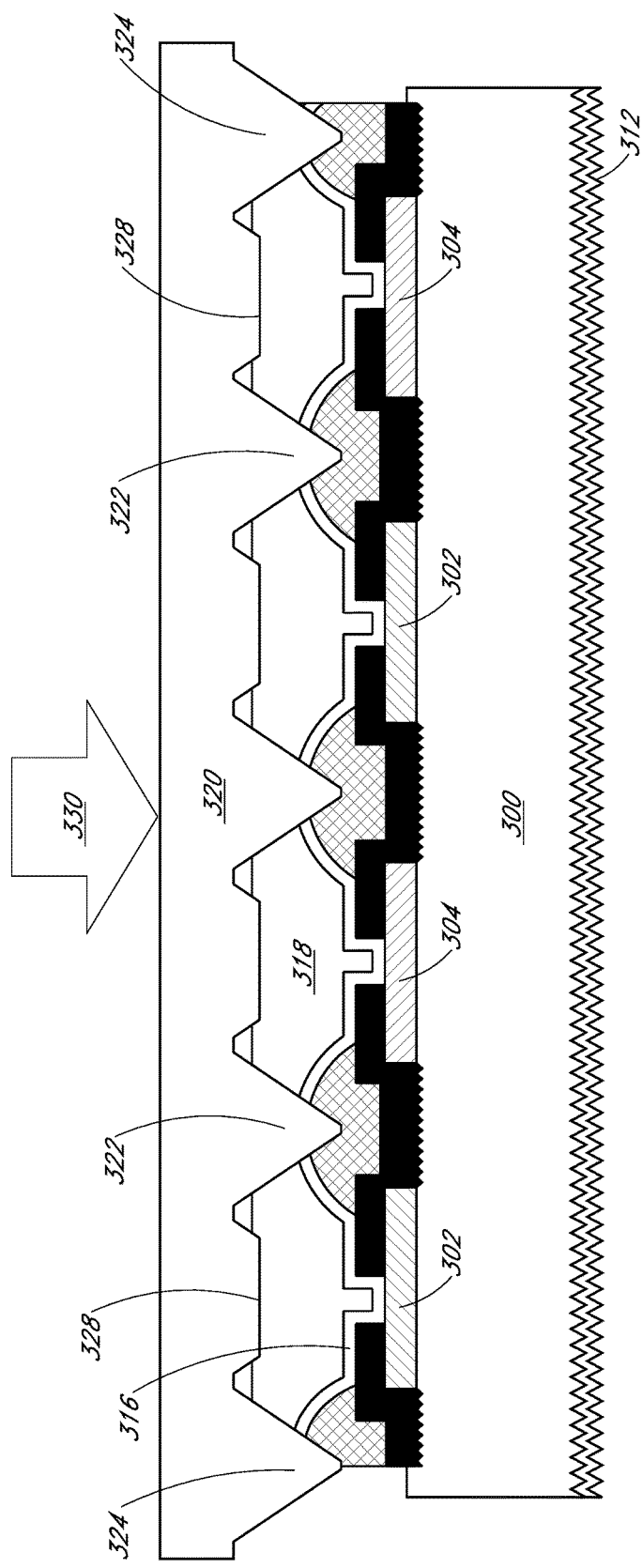
FIG. 3 illustrates cross-sectional view of a stage in the fabrication of a solar cell comprising compression bonding, according to an embodiment.

One or more embodiments comprise the step of bonding a metal foil to a metal seed layer or directly to a metallized substrate. In an embodiment corresponding to operation 160 of flowchart 100 and depicted in FIG. 3, the method of fabricating a solar cell comprises applying a mechanical force 330 to a cutting die 320 comprising a plurality of cutter blades 222 and a plurality of substantially planar regions 328 between the plurality of cutter blades 322. Upon application of the mechanical force 330 to the cutting die 320, the plurality of cutter blades 322 cut the metal foil 318 at locations between the plurality of semiconductor regions 302, 302. Simultaneously, upon application of the mechanical force 330 to the cutting die 320, the plurality of substantially planar regions 328 bond the metal foil 318 to the metal seed layer 316 and/or underlying semiconductor regions, thereby forming electrically conductive bonds between electrically isolated regions of the metal foil 318 and the plurality of semiconductor regions 302, 304. Not to be bound by any particular theory, but upon application of the mechanical force 330 to the cutting die 320, the plurality of substantially planar regions 328 bond the metal foil 318 to the metal seed layer (or other underlying layer) by means of a thermocompression bond, wherein the pressure on the metal foil creates a shearing at an interface between the foil and the underlying seed or semiconductor so as to break through surface oxides to produce a mechanical and electrically-conductive bond. As depicted in FIG. 3, the metal foil 318 is adhered to the alternating N-type and P-type semiconductor regions 302, 304 by pressing the plurality of substantially planar regions 328 of the cutting die 320 on the metal foil 318. The mechanical force 330 directly couples portions of the metal foil 318 with corresponding semiconductor regions 302, 304 and/or metal seed material regions 316 (if present). In some embodiments, a method for fabricating a solar cell comprises consecutive cutting and bonding operations, as opposed to simultaneous cutting and bonding operations.

As depicted in FIG. 2 and FIG. 3, the cutting dies 220, 320 comprise peripheral cutter blades 224, 324 for trimming metal foil 218, 318 at edge regions of the substrate 200, 300. However in other embodiments, peripheral cutter blades can be absent from a cutting die such that the cutting die comprises only cutter blades at non-edge regions of the substrate for electrically isolating regions of a metal foil. In yet other embodiments, a cutting die can comprise only peripheral cutting blades 424, such as depicted in FIG. 4.

Figure 4:
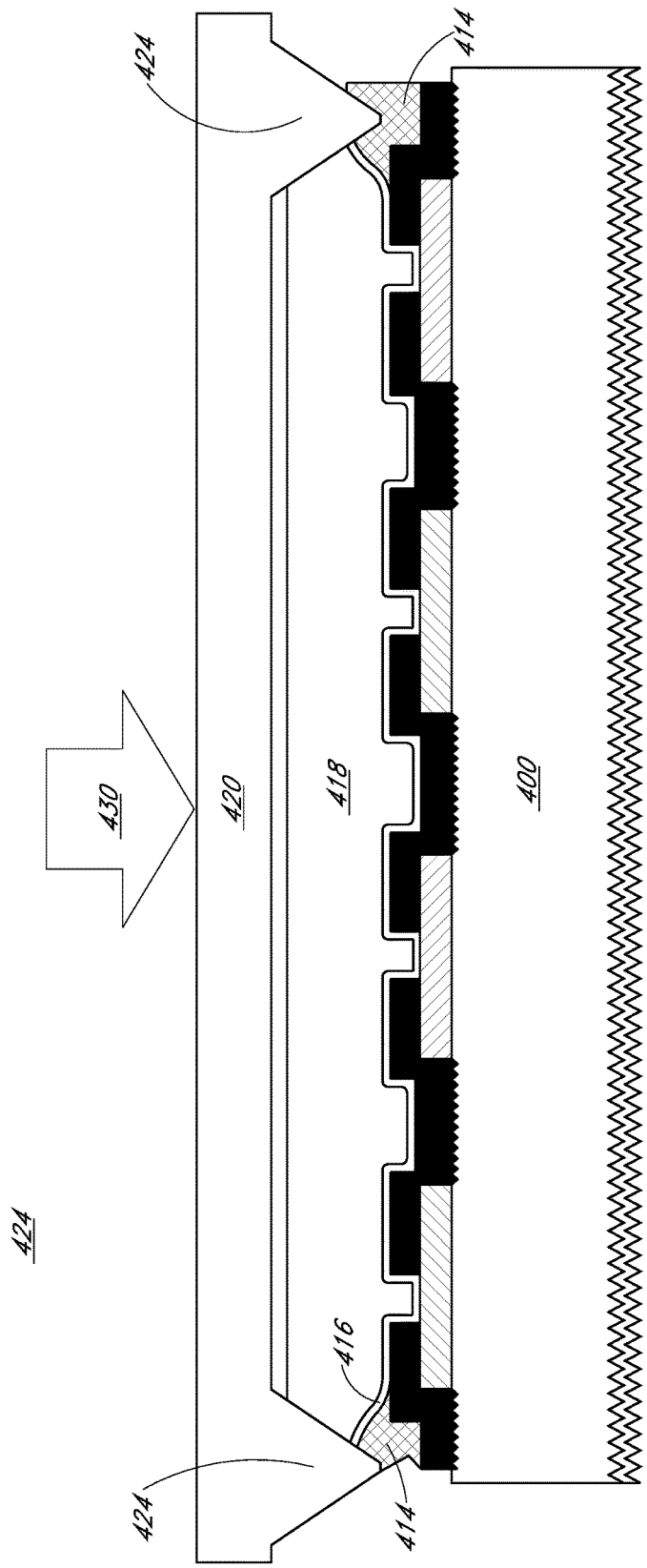
FIG. 4 illustrates cross-sectional view of a stage in the fabrication of a solar cell comprising trimming excel foil at edge regions, according to an embodiment.

In an embodiment corresponding to operation 160 of flowchart 100 and depicted in FIG. 4, the method of fabricating a solar cell comprises trimming a metal foil 418 by applying a mechanical force 430 to cutting die 420 comprising peripheral cutter blades 424. During the cutting operation, peripheral cutter blades 424 trim metal foil at edge regions of the substrate 400. A peripheral damage buffer 414 is disposed at edge regions of solar cell 401 to protect the underlying layers of the solar cell 401 during the cutting, or trimming operation depicted in FIG. 4.

Figure 5A:
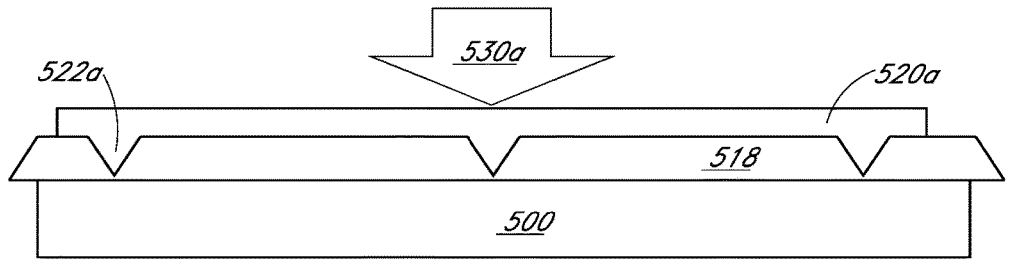
FIG. 5A-5F illustrate cross-sectional view of consecutive stages in the in the fabrication of a solar cell using a progressive die-cutting process, according to an embodiment.
Figure 5B:
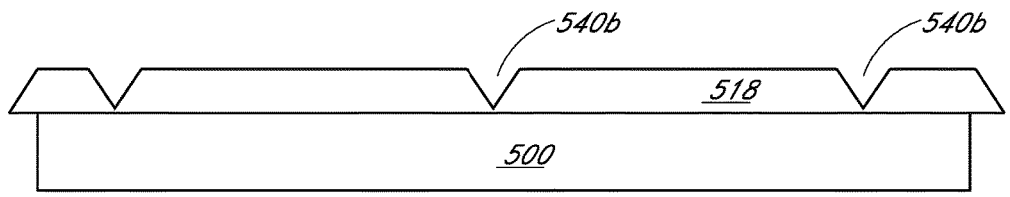
Figure 5C:
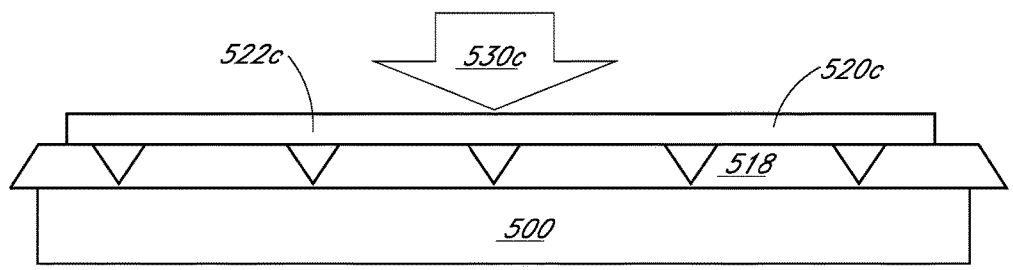
Figure 5D:
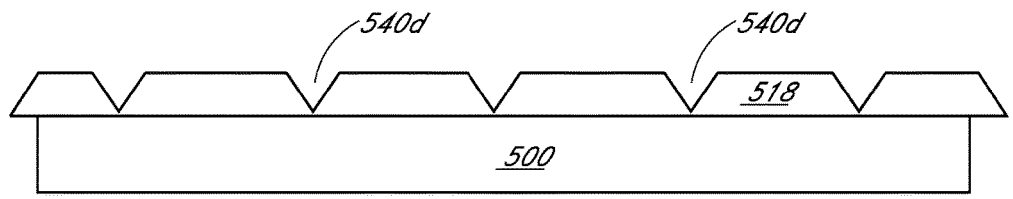
Figure 5E:
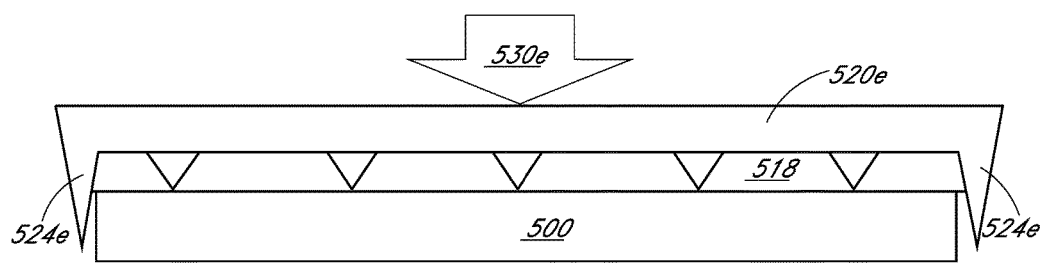
Figure 5F:
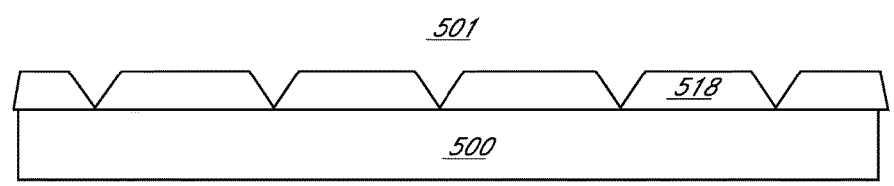

In some embodiments, a method of fabricating a solar cell includes a progressive die-cutting process comprising consecutively applying a series of mechanical forces to cutting dies to isolate regions of a metal foil and/or trim excess metal foil. As a non-limiting example, FIG. 5A-5F depict cross-sectional views of consecutive stages in a progressive die-cutting process for solar cell foil-based metallization. In FIG. 5A, a first mechanical force 530*a* is applied to cutting die 520*a* such that cutter blades 522*a* cut metal foil 518 to form a first pattern in metal foil 518. As depicted in FIG. 5B, the first pattern comprises a first set of grooves 540*b* in metal foil 518 at locations between underlying semiconductor regions (not pictured). As depicted in FIG. 5C, the method of fabricating a solar cell further comprises applying a second mechanical force 530*c* to cutting die 520*c* such that cutter blades 522*c* cut metal foil 518 to form a second pattern in metal foil 518. FIG. 5D depicts the second pattern comprising a second set of grooves 540*d* in metal foil 518 at locations between underlying semiconductor regions. In FIG. 5E, a third mechanical force 530*e* is applied to cutting die 520*e* such that peripheral cutter blades 524*e* trim metal foil 518 at edge regions of the wafer or substrate 500. A solar cell 501 fabricated in a progressive die-cutting process is illustrated in FIG. 5F. The solar cell 501 comprises a patterned metal foil 518 comprising indentations or grooves 540 corresponding to locations underlying semiconductor regions (not pictured).

In the non-limiting example of FIG. 5A-5F, three cutting dies and three cutting operations are employed in a progressive dies cutting process for ease of explanation. However, it should be appreciated that any desirable number of die-cutting steps can be employed with any desirable type of cutting dies, cutting die configurations, and/or applied mechanical forces. It is appreciated by the inventors that a progressive die-cutting process can be advantageous in that a lower mechanical force can be used in individual progressive cutting operations compared to a non-progressive die-cutting operation.

Figure 6:
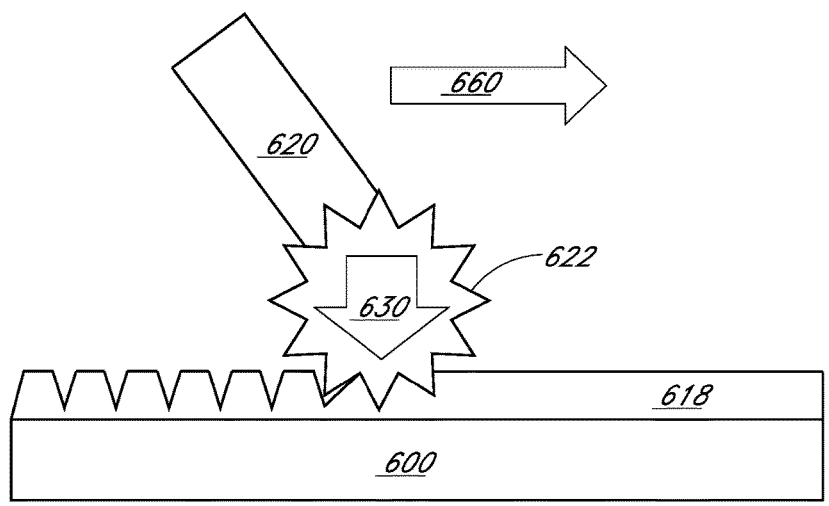
FIG. 6 illustrates cross-sectional view of a stage in the fabrication of a solar cell using a rotary cutting die, according to an embodiment.
Figure 7:
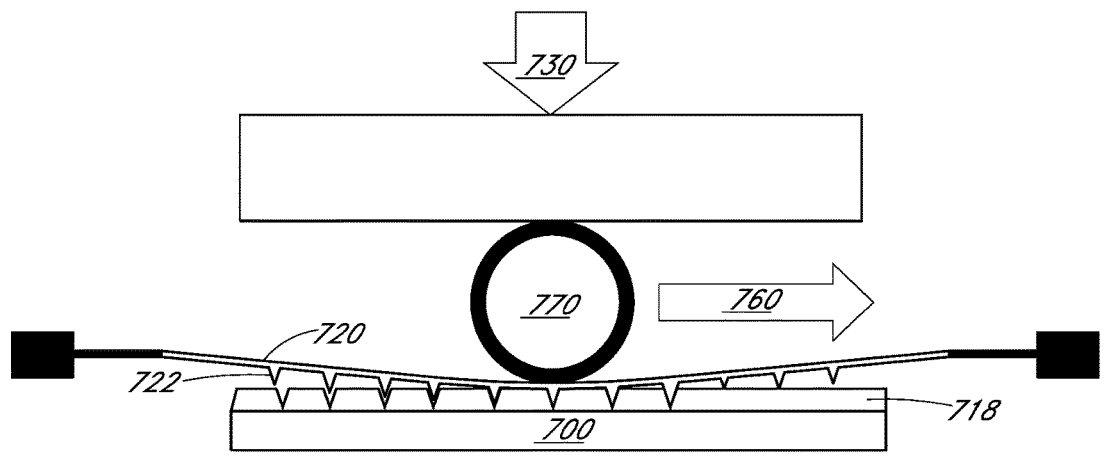
FIG. 7 illustrates cross-sectional view of a stage in the fabrication of a solar cell using a flexible cutting die, according to an embodiment.

In some embodiments, the method is a continuous process employing a cutting die having a generally curved or arcuate cross-section to isolate metal foil regions and/or trim excess metal foil. As a non-limiting example, FIG. 6 depicts a cross-sectional view of a cutting operation using a rotary cutting die. A rotary cutting die 620 comprising cutter blades 622 rolls across metal foil 618 in a first direction 660 while applying a mechanical force 630 on metal foil 618. Any desirable circumference, cutter blade number or configuration can be used in a foil-based metallization process using a rotary cutting die.

In another embodiment, a flexible cutting die can be employed to isolate metal foil regions and/or trim excess metal foil. In the embodiment depicted in FIG. 7, a flexible cutting die 720 comprising cutter blades 722 is flexed or deflected towards metal foil 718 by applying a mechanical force 730 on roller 770 moving in a first direction 760. Any suitable mechanism for flexing or deflecting cutter blades of a flexible cutting die can be employed. In some embodiments, a mechanical force can be directly applied to a flexible cutting die to flex or deflect cutter blades towards a metal foil. Furthermore, any desirable length, material, cutter blade number or configuration can be used in a foil-based metallization process using a flexible cutting die.

In some embodiments, the method further comprises locating a metal foil with the metallized surface of the wafer or substrate. For example, a metal foil can be located or fit-up with the underlying solar cell by forming a plurality of spot welds between the metal foil and the underlying solar cell using a tacking operation. A tacking operation can be a method of holding the metal foil in place on the wafer and transferring heat to the metal foil before bonding and/or cutting. Any desirable tacking operation can be employed, for example applying a bed of nails, localized heat or laser to form a plurality of spot welds.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase(s) "means for" or "step for," respectively.

The invention claimed is:

1. A method of fabricating a solar cell, the method comprising:
forming a plurality of alternating N-type and P-type polycrystalline silicon semiconductor regions on a single crystalline silicon substrate;
forming a patterned damage buffer in alignment with locations between the plurality of alternating N-type and P-type polycrystalline silicon semiconductor regions;
forming a metal seed layer over the patterned damage buffer;
placing a metal foil over the metal seed layer;
placing a cutting die above the metal foil, the cutting die comprising a plurality of cutter blades;
cutting the metal foil at locations between the plurality of alternating N-type and P-type polycrystalline silicon semiconductor regions by applying a mechanical force to the plurality of cutter blades to electrically isolate regions of the metal foil.

2. The method according to claim 1, wherein forming a patterned damage buffer comprises forming a patterned damage buffer having a thickness less than 30 μm.

3. The method according to claim 1, wherein placing a metal foil over the patterned damage buffer comprises placing an aluminum foil over the patterned damage buffer.

4. The method of claim 1, wherein placing a cutting die above the metal foil comprises placing a cutting die comprising cutter blades having a height no more than 50 μm greater than the thickness of the metal foil.

5. The method of claim 1, wherein placing the cutting die above the metal foil comprises placing a cutting die comprising at least one peripheral cutter blade above the metal foil; and wherein, cutting the metal foil by applying a mechanical force to the cutting die comprises trimming the metal foil by applying a mechanical force to the at least one peripheral cutter blade to trim the metal foil at edge regions of the substrate.

6. A method of fabricating a solar cell, the method comprising:
forming a plurality of semiconductor regions in or above a substrate;
forming a patterned damage buffer in alignment with locations between the plurality of semiconductor regions;
putting a metal layer over the patterned damage buffer;
placing a cutting die above the metal layer;
cutting the metal layer at locations between the plurality of semiconductor regions by applying a mechanical force to the cutting die.

7. The method according to claim 6, wherein putting a metal layer over the patterned damage buffer comprises forming a metal seed layer over the patterned damage buffer.

8. The method according to claim 6, wherein putting a metal layer over the patterned damage buffer comprises placing a metal foil above the patterned damage buffer.

9. The method according to claim 8, wherein placing a metal foil above the patterned damage buffer comprises placing a metal foil having a thickness less than 200 μm.

10. The method according to claim 8, wherein placing a metal foil above the patterned damage buffer comprises placing an aluminum foil above the patterned damage buffer.

11. The method according to claim 6, wherein forming a patterned damage buffer comprises forming a patterned damage buffer having a thickness less than 30 μm.

12. The method according to claim 6, further comprising heating the metal layer.

13. The method according to claim 12, wherein heating the metal layer comprises heating the metal foil between 100-600° C.

14. The method according to claim 6, wherein the cutting die comprises a plurality of cutter blades and a plurality of substantially planar regions between the plurality of cutter blades;
wherein upon applying a mechanical force to the cutting die, the plurality of cutter blades of the cutting die cut the metal layer at locations between the plurality of semiconductor regions; and, the plurality of substantially planar regions of the cutting die bond the metal layer to the plurality of semiconductor regions to form electrically conductive contacts.

15. The method of claim 6, wherein placing the cutting die and cutting the metal layer by applying a mechanical force to the cutting die forms a pattern on the metal layer; and, wherein the method further comprising forming another pattern on the metal layer by consecutively placing another cutting die and cutting the metal layer by applying another mechanical force, thereby isolating regions of the metal layer in a progressive die-cutting process.

16. The method of claim 6, wherein placing the cutting die above the metal layer comprises placing a rotary cutting die having a generally arcuate cross-section above the metal layer; and, cutting the metal layer comprises rolling the rotary cutting die across the metal layer.

17. The method of claim 6, wherein cutting the metal layer comprises flexing cutter blades of a flexible cutting die towards the metal layer.

18. A method of fabricating a solar cell, the method comprising:
    forming a plurality of alternating N-type and P-type polycrystalline silicon semiconductor regions on a single crystalline silicon substrate;
    forming a patterned damage buffer in alignment with locations between the plurality of alternating N-type and P-type polycrystalline silicon semiconductor regions;
    placing a metal foil over the patterned damage buffer;
    placing a cutting die above the metal foil, the cutting die comprising a plurality of cutter blades;
    cutting the metal foil at locations between the plurality of alternating N-type and P-type polycrystalline silicon semiconductor regions by applying a mechanical force to the plurality of cutter blades to electrically isolate regions of the metal foil.

19. The method according to claim 1, wherein forming a patterned damage buffer comprises forming a patterned damage buffer having a thickness less than 30 μm.

20. The method according to claim 1, wherein placing a metal foil over the patterned damage buffer comprises placing an aluminum foil over the patterned damage buffer.

* * * * *